(12) United States Patent
Zaput

(10) Patent No.: US 6,828,889 B1
(45) Date of Patent: Dec. 7, 2004

(54) RECONDENSING SUPERCONDUCTING MAGNET THERMAL MANAGEMENT SYSTEM AND METHOD

(75) Inventor: James Joseph Zaput, Holtsville, NY (US)

(73) Assignee: GE Medical Systems Information Technologies, Inc., Milwaukee, WI (US)

( * ) Notice: Subject to any disclaimer, the term of this patent is extended or adjusted under 35 U.S.C. 154(b) by 0 days.

(21) Appl. No.: 10/722,646

(22) Filed: Nov. 26, 2003

(51) Int. Cl.[7] .................................................. F17C 5/02
(52) U.S. Cl. .................... 335/216; 324/318; 62/47.1; 62/51.1; 505/892
(58) Field of Search .................... 335/216, 296–301; 324/318–320; 62/47.1–51.1; 505/892

(56) References Cited

U.S. PATENT DOCUMENTS

| | | | |
|---|---|---|---|
| 5,060,481 A | * 10/1991 | Bartlett et al. | ............... 62/51.2 |
| 5,150,578 A | * 9/1992 | Oota et al. | ............... 62/47.1 |
| 5,828,280 A | * 10/1998 | Spivey et al. | ............... 335/216 |
| 5,936,499 A | * 8/1999 | Eckels | ............... 335/216 |
| 6,011,456 A | * 1/2000 | Eckels et al. | ............... 335/300 |

* cited by examiner

Primary Examiner—Ramon M. Barrera
(74) Attorney, Agent, or Firm—Fletcher Yoder

(57) ABSTRACT

Heater duty cycle (the active pressure control circuit) in recondensing superconducting magnet systems is monitored to determine total thermal system performance, to minimize non-zero boil-off operation, and to reduce maintenance costs. Undesirable conditions, such as a degrading cold head, plumbing leaks, and so forth, may be detected earlier by monitoring heater duty cycle. Appropriate service intervals may be determined and cryogen or helium losses may be reduced. The technique provides earliest possible identification of failures related to such variables, as well as, facilitates isolation of the root cause of the problem. Monitoring of heater duty cycle (energization time) offers advantages over the traditional approach of monitoring or alarming on low level in the cryogen (helium) vessel. The technique may provide for relying on observation of the effects of reduced cooling capacity, such as abnormal heater duty cycle, early enough in the failure cycle to prevent helium loss and equipment damage.

42 Claims, 5 Drawing Sheets

RECONDENSING SUPERCONDUCTING MAGNET THERMAL MANAGEMENT SYSTEM AND METHOD

BACKGROUND OF THE INVENTION

The present technique relates to medical imaging devices and, more particularly, to imaging devices with cryogenic cooling systems.

A number of important applications exist for superconductive magnet systems. These include imaging systems, as for medical imaging, as well as spectrometry systems, typically used in materials analysis and scientific research applications. The present technique relates to management of cryogenically cooled superconductive magnets, and particularly to the monitoring and servicing of such systems. Although reference is made throughout the following discussion to imaging systems, it should be borne in mind that the technique is applicable to a range of systems that utilize cryogenically cooled superconducting magnets.

Imaging devices are omnipresent in typical medical environments. Medical practitioners, such as physicians, may employ medical imaging devices to diagnose patients. Imaging devices, such as Magnet Resonance Imaging (MRI) devices and Nuclear Magnetic Resonance (NMR) devices, produce detailed images of a patient's internal tissues and organs, thereby mitigating the need for invasive exploratory procedures and providing valuable tools for identifying and diagnosing disease and for verifying wellness.

Typical MRI and NMR devices develop diagnostic images by affecting gyromagnetic materials within a patient via controlled gradient magnetic fields and radiofrequency pulses in the presence of a main magnetic field developed by a superconductive magnet. During an MRI exam, a main magnetic field of upwards of two Tesla may be necessary to produce vivid images. Typically, superconductive electromagnets comprise loops of coiled wire, which are continuously bathed in a cryogen, such as liquid helium, at temperatures near absolute zero. For the example of bathing the coils with a liquid pool of helium, system temperatures are approximately −269° C. (or 4 K) near atmospheric pressure (e.g. less than 5 psig). When cooled to such extreme temperatures, the coiled wire becomes superconductive, i.e., the electrical resistance of the wire falls to essentially zero, enhancing the field strength without requiring significant energy input for continued operation. Advantageously, superconductive electromagnets reduce the electrical load requirements for producing the desired magnetic fields, thereby making the MRI system more economical to operate.

Challenges exist, however, in maintaining the electromagnets at these extreme temperatures which are significantly lower than ambient temperatures. Because of this temperature difference with ambient, a considerable driving force exists for heat transfer from the environment into the magnet system. Accordingly, thermal insulating material and other heat transfer barriers, such as vacuum regions, may insulate the magnet and cryogen to impede heat transfer from the environment. For environmental heat effects that reach the inner workings of the magnet system, the liquid pool of cryogen that surrounds the magnet must absorb the heat to maintain the magnet at desired temperature. Cryogens operating at or near their boiling points typically expend this external heat by vaporizing relatively small amounts of cryogen.

In general, the cryogen liquid pool and its heat of vaporization consume heat while maintaining the magnet at constant temperature. On the whole, cryogen liquid pools in well-insulated systems, such as typical superconducting magnet systems, are able to absorb heat transferred from the environment over relatively long periods of time to maintain the magnet at desired temperature. Other systems with refrigerants operating below their boiling points (i.e., super-cooled) and which primarily absorb heat via sensible heat increases, typically require more refrigerant and processing of the refrigerant. Additionally, for liquid pools relative to other techniques, the magnet temperature, in some circumstances, may be better maintained constant because, in part, the cryogen boils at fairly constant temperatures at moderately fixed pressures.

Furthermore, liquid pools of cryogens may be suitable for superconducting applications because magnet temperature may be controlled by controlling cryogen pressure at a specified pressure that gives a liquid pool boiling temperature that corresponds to the desired magnet temperature. This may prove advantageous over direct control of temperature because pressure measurement may generally be a more economical and reliable application than temperature measurement. Additionally, because cryogens, such as helium, boil in the desired lower temperature ranges at slightly positive pressures (e.g., near atmospheric at 0–5 psig), vacuum operating conditions are generally not needed to induce low boiling temperatures, thus permitting simpler and more economical system design and operation.

Cryogenic liquids, such as liquid helium, however, are relatively expensive to refine and maintain. Therefore, the aforementioned advantages of cryogen in superconducting magnets applications may be offset if cryogen losses are excessive. Accordingly, older approaches of "open" systems which have no recondensing capability and where cryogen vapor is normally vented to the atmosphere, have generally fallen out of favor in the industry. In these systems, as the liquid cryogen absorbs environmental heat in maintaining the desired magnet temperature, vaporized cryogen is normally vented to limit pressure increases and thus to limit temperature increases. The simplicity, however, of relying solely on a vent or relief device to control the high end of cryogen pressure is usually offset by additional costs and downtime of servicing and refilling the cryogen system.

While the economic operation of the system is desirable, there is the environmental consideration driven by the reality that helium is a finite natural resource.

Once extracted from the ground (helium is a refined by-product of natural gas extraction) it is not replenished. The utmost care must be employed to ensure closed systems remain closed. Once vented by the relief valve in an overpressure condition OR accidentally by an unintentional plumbing leak those molecules are gone forever into the atmosphere. Helium's density being lighter than most other elements rises, and because of this does not remain at ground level in sufficient concentration for atmospheric extraction and re-processing.

Therefore, to conserve cryogen, such as helium, and to support cryogen pressure control, magnet systems in typical MRI devices may now include a cryogen condensing system, which recondenses volatilized cryogen back into its liquid phase. That is, cryogen is maintained in a sealed cryogen vessel (or cryostat) that provides cryogen vapor (i.e., gaseous helium) to the condensing system and receives liquid cryogen (i.e., liquid helium) from the condensing system in a closed loop process. The condensing system condenses cryogen vapor, thus recovering the vapor, as well as, maintaining the cryogen pressure below the set point of the vent or relief device. On the flip side, as discussed more below, a heater may be used to prevent the cryogen pressure from dropping too low. In sum, for the older open systems, a loss in cryogen level is expected and the timing of service intervals is typically based on this loss of level. In contrast, for recondensing magnets systems which recover the vaporized cryogen, losses in cryogen liquid level are not expected during normal operation. Thus, recondensing magnet systems generally retain cryogen level and reduce the requirement of periodic refilling of cryogen.

Recondensing magnet systems, however, from time to time, require maintenance, for example, when the cryogen condensing system may require repair or replacement. In particular, the performance of the condensing system components will degrade due to wear, thereby reducing the efficacy of the condensing system and overall magnet cooling system (cryogenic cooling system). Moreover, leaks within the cryogen (helium) vessel and/or condensing system, again for example, may also reduce the efficacy of the cooling system. During maintenance, it may become necessary to disengage the condensing system, cooling system, and/or deactivate the MRI devices, events that are to be avoided. If the cryogen condensing system is off-line or not condensing effectively, more of the liquid cryogen may begin to volatilize, leading to an increase of pressure in the cryogen vessel (i.e., cryostat). To prevent adverse effects due to the increased pressure, traditional devices, such as a relief valve is installed, for example, on the cryogen vessel to relieve pressure by venting some of the gaseous cryogen to the atmosphere. This conversion of liquid cryogen, such as liquid helium, to its gaseous state, and/or the subsequent venting of the gas, is generally known in the industry as "boil-off." Venting of the gas leads to permanent loss of expensive cryogen, requiring refilling of the system. Again, this venting is expected during normal operation of open systems but may be substantially avoided in recondensing systems.

Recondensing technology may provide net "zero boil-off" systems in which a refrigeration system or "cold head" (also called cryo-cooler or cryo-condenser) typically runs continuously to condense (and re-condense) vaporized cryogen. An electric heater in the vessel heats the cryogen to maintain a desired pressure level, thereby preventing the vessel pressure from falling below a desired level that could result in drawing atmospheric gases into the vessel. A balance is maintained between cooling components (condensing) and heating components (vaporizing) which can be continuously monitored. In contrast, with "open loop" thermal designs, such as those without recondensing technology, the expected boil-off results in a measurable drop in liquid level in the vessel over time. In some configurations, this drop in liquid level may manifest in a reduction in the reading, for example, on a provided liquid level gauge. Historically, with open systems, the percent rate of drop in a volumetric table unique to each magnet system (i.e., in each MRI system) defines the boil-off rate, for example, expressed as liters per hour consumption. For open systems, this boil-off rate is compared to design norms to determine total thermal system performance and used to determine service intervention. On the contrary, properly operating recondensing systems experience no loss of cryogen level, employing the refrigerating action of a cold head to provide controlled zero boil-off (COBO) with very high percentage cryogen (helium) recovery. Though true zero boil-off systems are not physically possible, the operation of condensing the helium vapor and returning the condensed helium to the helium vessel (cryostat) liquid pool may approach ideal conditions.

A problem is that the previous methods of evaluating thermal system performance which depended upon observing a drop in liquid level and then comparing the results to design norms are generally not adequate for recondensing systems. During normal and early failure modes, recondensing thermal systems, by design, exhibit no drop in liquid level over time thereby preventing prompt identification failure until the problem becomes severe enough, for example, that the pressure relief valve opens the previously closed system and gas is vented resulting in the liquid level dropping. It should be emphasized that level based methods of evaluating magnet thermal performance may be inadequate to fully understand and respond to problems affecting recondensing magnet performance.

Traditionally, the maintenance of cooling systems in MRI devices is a reactive process. That is, technicians are generally called when, for example, image quality has been affected, a critical indicator has activated, and/or the system is no longer operable. For example, a typical system may generate a service call when a low level of cryogen is detected due to venting or leaks in the system. In addressing concerns reactively, the repair time and/or off-line periods may be longer than desired. For example, certain parts and/or technicians may not be immediately available, leading to longer than necessary downtimes (i.e., off-line time). Moreover, periods of reactive maintenance may not coincide with already scheduled routine maintenance procedures, leading to duplicative downtimes for the MRI device. Similarly, when substantial quantities of cryogen are required, very significant costs may be incurred in refilling the serviced system.

Similar problems exist even prior to the time such magnets are placed in operation. For example, magnets are typically built and tested in a controlled factory environment, then at least partially disassembled from other support equipment for shipping. Current procedures for building, testing and shipping superconductive magnets do not, however, adequately accommodate boil-off or servicing needs. In much the same way, mobile MRI systems and systems where communications infrastructures are less available pose particular challenges beyond those of traditional fixed locations in hospitals. Such challenges include cryogen monitoring and servicing, but also location and identification of the systems, and communication of relevant parameter data to a monitoring or service-coordinating location.

Accordingly, there is a need for an improved technique for maintaining cryogen cooling systems. Particularly, there is a need for a technique that reduces maintenance times, periods of deactivation, costs, and so forth.

BRIEF DESCRIPTION OF THE INVENTION

The present invention provides a novel technique designed to respond to such needs. The technique provides for observation of duty cycle of the active pressure control circuit (i.e., the heater duty cycle) to determine total thermal system performance. The technique may accommodate a multitude of variables that may contribute to non-zero boil-off operation of recondensing thermal systems. Such variables may include, for example, degrading cooling capacity of the cold head (cryo-cooler machine) over its operation life, plumbing leaks in the pressure system that violate the close system requirement, environmental effects such as facility issues preventing optimal cold head (cryo-cooler system) functionality, and so forth. The technique provides earlier possible identification of failures related to such variables, as well as, facilitates identification of the nature or root cause of the problem. The technique may provide for relying on observation of the effects, such as abnormal heater duty cycle, or of problems, such as reduced cooling capacity, early enough in the failure cycle to facilitate predictive maintenance, reduce maintenance costs, reduce downtime, prevent helium loss, and the like. Monitoring of the heater duty cycle (e.g., energization time) may offer advantages, such as improved predicted maintenance, over the traditional approach of monitoring or alarming on low level in the cryogen (helium) vessel. It also may offer similar advantages over monitoring pressure in the cryogen vessel.

Aspects of the invention, for example, provide a method for operating a superconducting magnet system, including monitoring a duty cycle of a heating element that supplies heat to the superconducting magnet system, comparing the duty cycle to a predetermined value, and providing an indication of a condition of the magnet system based upon the comparison. The duty cycle may represent the periods of time that the heating element is energized and may be expressed in percent of the time the heating element is energized. The periods of time may be non-uniform lengths of time with a substantially constant amplitude of energization and with the heating element configured in an on/off control scheme (a constant heater when energized). The predetermined value of the duty cycle generally corresponds to an operating norm of the duty cycle and an exemplary specified tolerance is 50 percent of the predetermined value. The method may further include notifying a technician or alarming when the duty cycle falls outside a tolerance. The duty cycle may be monitored remotely and used as a variable to determine when the superconducting magnet system is to be serviced. The method may further identify the root causes of changes in the duty cycle. The amplitude of energization may vary and the heating element may be a variable heater in a proportional-integral-derivative (PID) control scheme. In general, the amplitude of energization may vary and the periods of time the heating element is energized may be constant. Moreover, the superconducting magnet system may provide one or more magnetic fields in a magnetic resonance imaging (MRI) system. Finally, the pressure in the cryogen vessel in the superconducting magnet system may be monitored and used as a variable in determining when the superconducting magnet system is to be serviced.

Other aspects of the invention provide a method for monitoring a superconducting magnet system, including monitoring an energization of a heating element that supplies heat to a superconducting magnet system, comparing the energization to a specified tolerance, and indicating when the energization falls outside the specified tolerance. The energization may be controlled, monitored remotely, and used as a variable to determine when the superconducting magnet system is to be serviced. Additionally, indicating when the energization falls outside the specified tolerance may include at least one indicia of a signal to an indicator or indicator system, an audible alarm, a signal to a control system, an indicating light on a graphical-user interface, and an electronic message. Further, the superconducting magnet system is repaired or re-configured in response to indication of the energization falling outside of the specified tolerance and to conform the energization to within the specified tolerance. Moreover, the superconducting magnet system provides one or more magnetic fields in at least one of a magnetic resonance imaging (MRI) system, nuclear magnetic resonance (NMR) system, and a spectroscopy system.

Yet other aspects of the invention provide a method for operating a superconducting magnet system, including monitoring a duty cycle of a pressure control circuit that controls pressure in a cryogen vessel in the superconducting magnet system, comparing the duty cycle to a predetermined value, and providing an indication of a condition of the magnet system based upon the comparison. The cryogen vessel holds a helium liquid pool that surrounds one or more magnets in the superconducting magnet system.

Facets of the invention provides a superconducting magnet system, including a cryogen vessel that contains or surrounds one or more magnets disposed in the superconducting magnet system, a heating element disposed within the cryogen vessel, a heater controller for controlling energization of the heating element which vaporizes a cryogen liquid disposed in the cryogen vessel, a monitoring system comprising one or more interfaces and one or more sensors for remotely monitoring the energization of the heating element, and one or more indicators for indicating when the energization falls outside a predetermined tolerance. A relief device may be disposed on or near the cryogen vessel. Moreover, the energization of the heating element may be adjusted to control pressure in the cryogen vessel and to control temperature of the one or more magnets. The cryogen liquid may comprise helium liquid, the pressure of the cryogen vessel may be controlled in the approximate range of 4.0 to 4.5 psig, and the temperature of the magnets may be controlled at approximately 4 Kelvin. The system may include a cold head for condensing cryogen vapor from the cryogen vessel, and wherein operation of the cold head affects cryogen pressure and thus affects the temperature of the one or more magnets. Moreover, the heater controller may be configured for at a constant heater in an on/off control scheme with constant amplitude energization while the heater is on and the heating element is energized, and wherein the periods of time the heating element is energized are non-uniform in length of time. On the other hand, the heater controller may be configured for a variable heater in a proportional-integral-derivative (PID) control scheme with variable amplitude energization of the heating element.

In accordance with aspects of the invention, a superconducting magnet system includes a heater controller that controls an energization rate of a heating element disposed within the superconducting magnet system, a control system with one or more interfaces and one or more sensors for remotely monitoring the energization rate of the heating element; and one or more indicators for indicating when the energization rate of the heating element falls outside a specified tolerance. The superconducting magnet system may be disposed within a magnetic resonance (MR) imaging system, and the one or more interfaces for monitoring the energization of the heating element may include at least one of a laptop, a computer, a workstation, a network connection, and a MR imaging system interface. The system may further include a cryogen vessel disposed in the superconducting magnet system and holding a cryogen at its boiling point for cooling one or more magnets, a cold head configured for removing heat from the superconducting magnet and condensing cryogen vapor received from a vapor space of the cryogen vessel, a refrigerant compressor system that supplies refrigerant to the cold head to cool the cold head, and a relief vent disposed in the superconducting magnet system for relieving cryogen vapor to control pressure and temperature within the superconducting magnet system.

In accordance with other aspects of the invention, a system for operating a superconducting magnet system includes means for controlling and adjusting the energization of a heating element that supplies heat to the superconducting magnet system, means for monitoring the energization of the heating element, means for comparing the energization of the heating element to a predetermined value, and means for providing an indication of a condition of the magnet system based upon the comparison. The means for controlling energization may control the temperature of one or more magnets disposed in the superconducting magnet system by controlling pressure within a cryogen vessel that surrounds the one or more magnets. Additionally, the system may have means for remotely monitoring the energization of the heating element.

Another example is a system having means for notifying a technician when the energization falls outside a specified tolerance, means for identifying one or more root causes of changes in the energization, means for conforming the energization of the heating element to within the specified tolerance, means for relieving pressure and cryogen vapor from the superconducting magnet system, and means for condensing the cryogen vapor disposed within the superconducting magnet system and for removing heat from the superconducting magnet system. One embodiment includes a system for monitoring a superconducting magnet system having means for monitoring a duty cycle of a heating element that supplies heat to the superconducting magnet system, means for comparing the duty cycle to a predetermined value, and means for providing an indication of a condition of the magnet system based upon the comparison. The superconducting magnet system may be disposed in a magnetic resonance imaging (MRI) system, nuclear magnetic resonance (NMR) system, a spectroscopy system, and the like. Moreover, a computer program, provided on one or more tangible media, for operating a superconducting magnet system, may include a routine for controlling and adjusting the energization of a heating element that supplies heat to the superconducting magnet system, a routine for remotely monitoring the energization of the heating element, a routine for comparing the energization of the heating element to a predetermined value, a routine for providing an indication of a condition of the magnet system based upon the comparison, and a routine for notifying a technician when the energization falls outside a specified tolerance. Finally, another computer program, also provided on one or more tangible media, for monitoring a superconducting magnet system, may include a routine for monitoring a duty cycle of a heating element that supplies heat to the superconducting magnet system, a routine for comparing the duty cycle to a predetermined value, a routine for providing an indication of a condition of the magnet system based upon the comparison, and a routine for controlling energization of the heating element.

DETAILED DESCRIPTION OF SPECIFIC EMBODIMENTS

Figure 1:
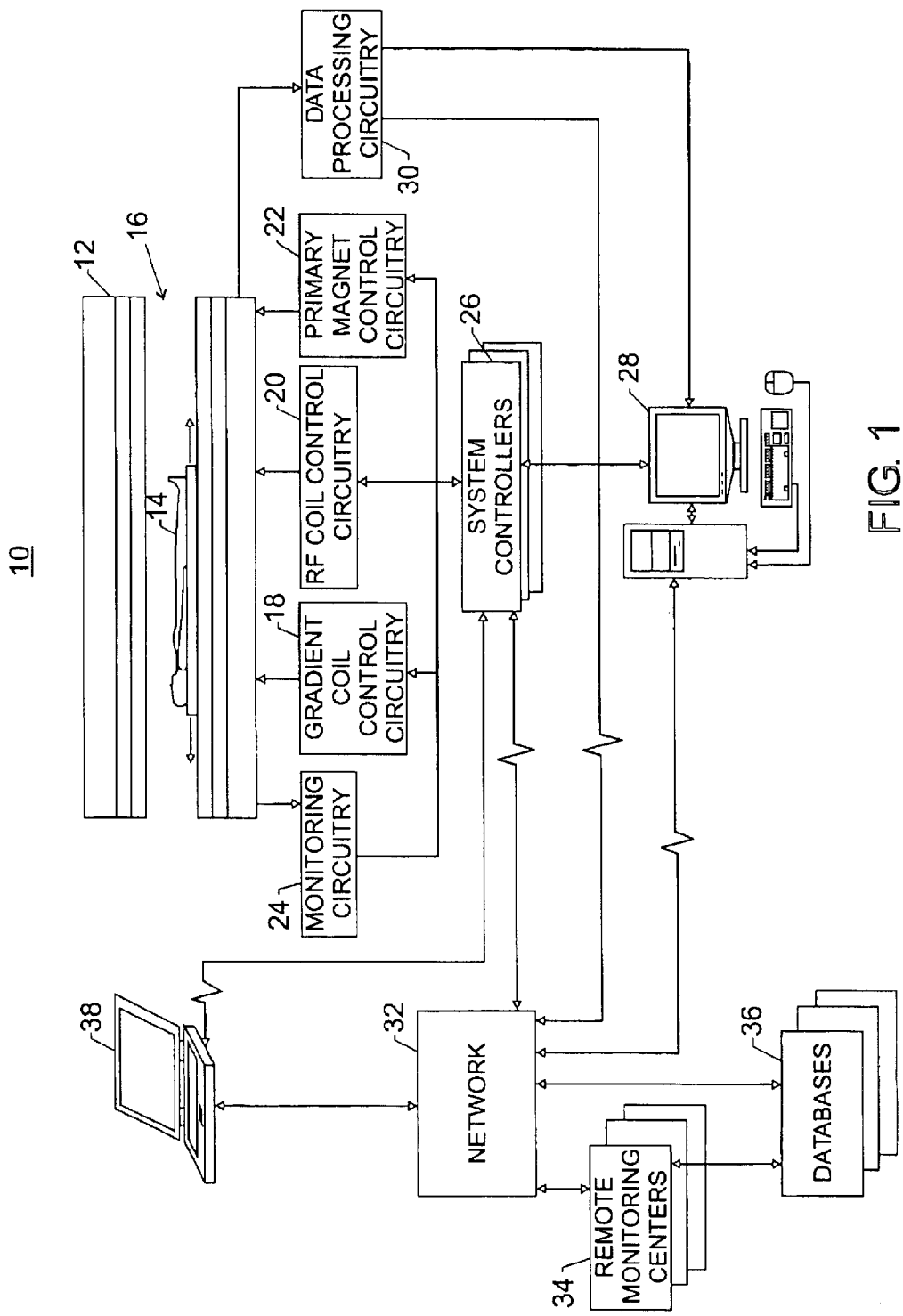
FIG. 1 is a diagrammatical representation of an exemplary imaging network having features in accordance with the present technique.

Turning to the drawings, and referring first to FIG. 1, an exemplary imaging network 10 is illustrated. Although the present technique is described with respect to a medical imaging device, it should be noted that the present technique may be applied to any number of systems or devices that employ a cryogen cooling system, such as spectroscopy systems, nuclear accelerators, biological cooling facilities, and power transmission systems, to name but a few. The exemplary imaging network 10 includes a magnetic resonance imaging scanner 12.

To obtain diagnostic images of a patient 14, a medical professional may direct the patient 14 into a patient bore 16 of the MRI scanner 12. A main magnetic field (i.e., 0.5–3.0 Tesla) is generally present in the patient bore 16. This field, as discussed further below, is produced by a superconductive electromagnet (see FIG. 2) disposed circumferentially about the patient bore 16. The superconductive electromagnet is maintained at superconducting temperatures (e.g., 1–5 degrees Kelvin) to reduce the electrical resistance in the magnet coils to substantially zero. Advantageously, the superconductive nature of the electromagnet reduces the electrical requirements for producing the magnetic field, thereby making the MRI scanner 12 more economical to operate. Additionally, to manipulate the main magnetic field and to obtain diagnostic images, the MRI scanner 12 includes gradient magnets or coils, and radio frequency (RF) coils (not shown), both of which may be of generally known construction.

Operation of the MRI scanner 12 may be controlled and/or monitored by any number of control and monitoring circuits. By way of example, the gradient coils, the RF coils, and the main magnet may be controlled by gradient coil control circuitry 18, RF coil control circuitry 20, and main magnet control circuitry 22, respectively. Moreover, as discussed further below, various operations and conditions of the MRI scanner 12 may be monitored by monitoring circuitry 24.

Certain of these control and monitoring circuits may function under the direction of one or more system controllers 26, such as the heater controller and cooling system controller discussed further below. The system controller may include any suitable programmable logic device, such as a CPU or a digital signal processor of a general purpose or application. The system controller also may include memory circuitry, such as volatile and non-volatile memory devices, for storing physical and logical axis configuration parameters, examination pulse sequence descriptions, acquired image data, programming routines, and so forth, used during the examination sequences implemented by the scanner. Advantageously, the system controllers 26 may permit some amount of adaptation or configuration of the examination sequence by means of an operator interface 28. The operator interface 28 may be a computer terminal that provides a graphical user interface (GUI) to an individual for the receipt of information from and the input of commands to the MRI scanner 12.

Additionally, the MRI scanner 12 may be coupled to data processing circuitry 30, which receives the detected imaging signals and processes the signals to obtain data for image reconstruction. In typical MRI scanners 12, the data processing circuitry 30 digitizes the received signals and performs a two-dimensional fast Fourier transform on the signals to decode specific locations in the selected slice from which the received signals originated, thereby producing image data representative of the patient's internal tissue and organs, or more generally, features of interest of a subject. The resulting image data may be forwarded to the operator interface 28 for viewing. The image data may also be sent to a remote data repository for storage, as discussed further below. Advantageously, the data processing circuitry 30 may perform a wide range of other functions, such as image enhancement, dynamic range adjustment, intensity adjustment, smoothing, sharpening, and so forth. However, it should be appreciated that such functions may also be performed by software and/or hardware included in the operator interface 28 as well as at remote locations, which are discussed further below.

In many instances, the MRI scanner 12 may communicate with remote locations and devices via a network 32, such as a Local Area Network (LAN), a Server Area Network (SAN), a Metropolitan Area Network (MAN), a Wide Area Network (WAN), a Virtual Private Network (VPN), the Internet, or any other suitable kind of network. Communications over the network 32 may be conducted via any number of communications schemes and protocols, such as Global Standard for Mobile (GSM), Time Division for Multiple Access (TDMA), Code Division Multiple Access (CDMA), Frequency Division Multiple Access (FDMA), radio frequencies (RF), or any other suitable communications techniques. By way of example, the imaging network 10 may include remote monitoring centers 34, which may receive operation data and imaging data from the MRI scanner 12 via the network 32. Advantageously, the remote monitoring centers 34, via the network 32, may improve the image data quality as well as monitor and adjust the operating parameters remotely.

The network 32 may also facilitate access to remote databases 36. Advantageously, the remote databases 36 may store large volumes of image data and operating data from a wide variety of sources coupled to the network. That is, data from multiple MRI scanners 12 and patients 14 may be stored in a central location. Indeed, image or operating data may be accessed by user interfaces 28 at locations remote from the imaging scanner 12.

In certain instances, a field technician may wish to access data or operating parameters from the MRI scanner 12. Accordingly, a field unit 38, such as a laptop computer or hand-held device, may be linked to the system controllers 26. To improve portability, the field unit 38 may be configured to communicate with the system controllers 26 via a wireless protocol, such as IEEE 802.11(b), Bluetooth, or RF communications. Advantageously, the field technician, via the field unit 38, may be able to monitor operations of the MRI scanner 12 and provide system adjustments in response, to improve the quality of the images produced. Of course, the field unit 38 may also communicate with the imaging scanner 12 via the network 32.

Figure 2:
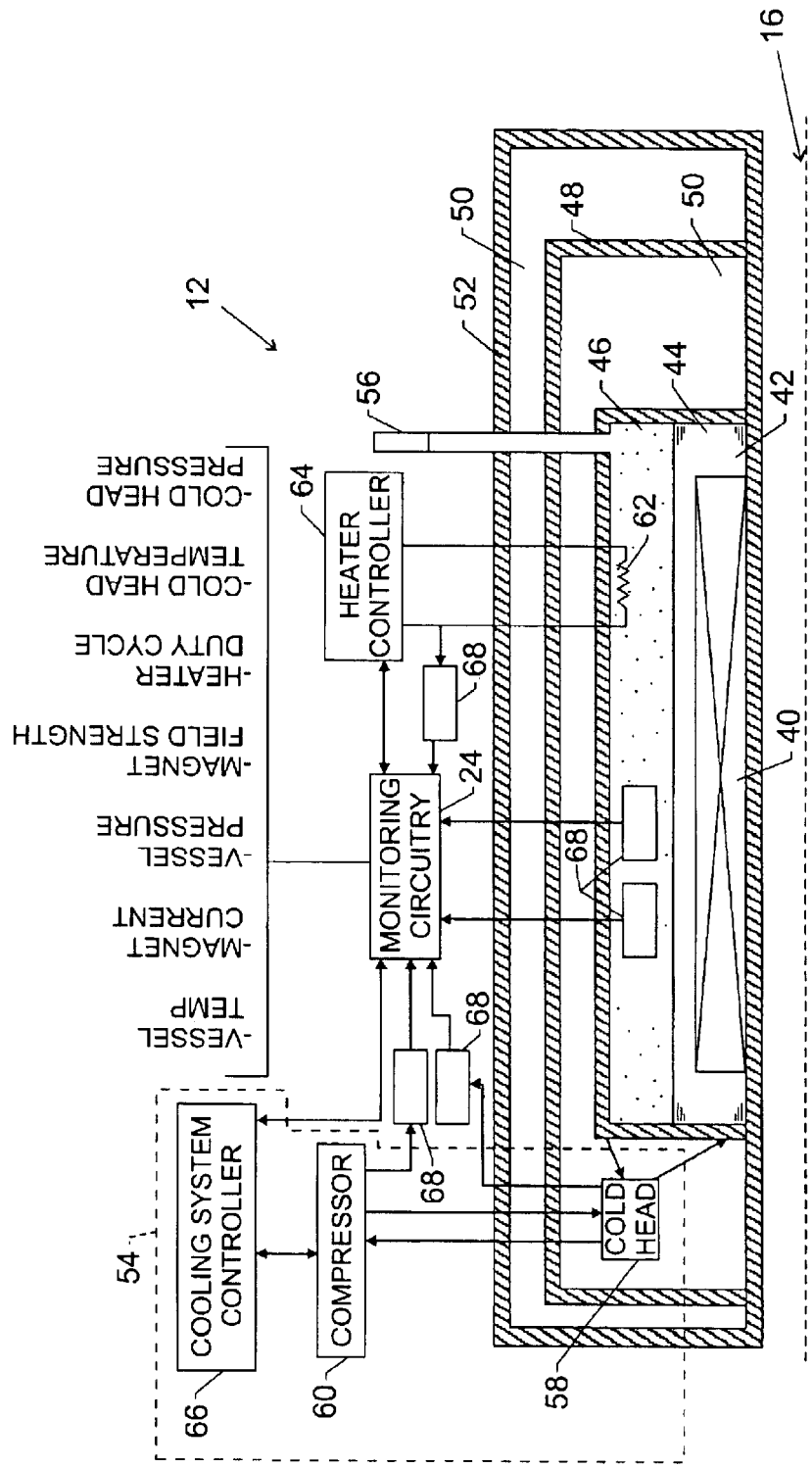
FIG. 2 is a partial cross-sectional view of an exemplary imaging device having features in accordance with the present technique.

Turning to FIG. 2, a partial cross-sectional view of an MRI scanner 12 is presented. As discussed above, the MRI scanner 12 maintains a main magnetic field of approximately 0.5 to 3.0 Tesla in the patient bore 16. To produce the main magnetic field, the exemplary MRI scanner 12 includes a magnet 40 located towards the center of the MRI scanner 12 and disposed circumferentially about the patient bore 16. The main magnet is an electromagnet formed of loops of coiled wire. Routing electrical current through the coiled wire produces a magnetic field. To reduce the electrical load necessary to produce the desired main magnetic field, the exemplary electromagnet may be cooled to a superconductive state. It should be noted that only an upper portion (i.e., above the centerline) of the exemplary, tubular MRI scanner 12 is illustrated in FIG. 2. Because of the tubular design, the lower portion is similar to the upper portion, and, as such, the lower portion is not separately discussed.

It should also be noted that, although a tubular scanner structure is described here, other geometries of magnets are known and presently in use, and can benefit from aspect of the present technique. For example, split imaging systems are known, in which an imaging volume is defined between two separated magnet sections. The sections are typically positioned either one above the other, or in a side-by-side arrangement. In either case, however, the superconductive magnet is cooled by a cryogenic system that may be maintained and serviced as described below.

To transition the electromagnet to a superconductive state, the electromagnet 40 may bathed in a cryogen, such as liquid helium 42, contained in a helium vessel 44, which circumscribes the patient bore 16 and surrounds the electromagnet 40. The liquid helium cools the electromagnet to superconductive temperatures (e.g., $-269°$ C. or 4 K). At superconductive temperatures, the electromagnet 40 (i.e., the loops of coiled wire) conducts electrical current essentially free of electrical resistance. Of course, the particular temperature at which the magnet materials transition to a superconducting state may vary depending upon the material used, and the specific temperature is not a limitation of the present technique. Advantageously, a relatively strong magnetic field (0.5–3.0 Tesla) may be produced at lesser electrical loads in comparison to traditional magnets, thereby reducing the operating costs of producing and maintaining the magnetic field. Other field strengths are, of course, possible, with spectroscopy and other systems obtaining significantly higher flux densities.

Liquid helium 42, similar to other cryogens, vaporizes into a gaseous state, such as gaseous helium or helium vapor 46, at relatively low temperatures (e.g., liquid helium boils at 4.2 K under standard pressure conditions). Accordingly, to insulate the helium 42 and 46 from external heat sources, the helium vessel 44 may be surrounded by a radiation heat shield 48. Advantageously, a vacuum region 50 is located between the helium vessel 44 and the heat shield 48, as well as between the heat shield 48 and an outer housing 52 of the MRI scanner 12 to further insulate the helium vessel 44 and magnet 40 from external heat sources.

Furthermore, as also discussed further below, the vaporization of the liquid helium 42 typically increases the pressure in the helium vessel 44. Accordingly, the helium vessel 44 may be coupled to a vent or relief valve 56. In a present embodiment, for example, if pressure in the helium vessel 44 exceeds a desired operating pressure (e.g., 4 psig) and reaches a relieving set point (e.g., 4.5 psig), the vent may release excess helium 46 to relieve the pressure. However, because helium is relatively expensive, the venting of the helium is to be avoided.

To conserve helium, the helium vessel 44 is coupled to a cryogen condensing system 54 (also called cryo-cooler or cryo-condenser), which recondenses gaseous helium 46 back into its liquid phase 42. In the exemplary MRI scanner 12, the cryogen condensing system 54 includes a cold head 58 coupled to a compressor 60. In one embodiment, the compressor 60 is a two stage coldhead machine with the second (colder) stage cooling the recondensor (cold head 58) while the first stage cools the heat shield 48. As appreciated by those skilled in the art, the compressor 60 pressurizes a refrigerant, such as helium gas (in a circuit separate from the liquid bath), and circulates the refrigerant to the cold head 58. By allowing the refrigerant to decrease in pressure in the coldhead 58, the fins (not shown) of the coldhead 58 (recondensor) may be conduction cooled to the condensation point of the cryogen, that is, a low enough to cause the helium vapor 46, for example, to return to its liquid phase. In a cyclical manner, the helium vapor 46 (gaseous helium) is routed from the vessel (i.e., rises from the vessel) to the recondensor (coldhead 58) and across the fins. The fins, which are cooled to approximately 2–4 K, provide heat transfer surface area and condense the helium vapor back into its liquid phase. The recondensed liquid helium 42 is routed (i.e., by gravity) back into the helium vessel 44, thereby conserving the helium in the vessel 44 and producing an equilibrium between the liquid and gaseous phases of the helium.

During operation of the MRI scanner 12, it may be advantageous to maintain the pressure within the helium vessel 44 within predetermined parameters, e.g., 4.0 to 4.5 psig. However, if, for example, the equilibrium in the helium vessel 44 is biased towards the liquid phase of the helium by the cold head 58, the helium vessel 44 may reach a negative pressure condition allowing atmospheric gases to be drawn into the vessel 44. If atmospheric gases enter the helium vessel 44, water vapor and other elements in the atmosphere may freeze, causing clogs in the cooling system that degrade the performance and, in certain instances, leading to failure of the cooling system 54 and/or the MRI scanner 12. Thus, to increase the pressure and prevent a vacuum, a heating element 62, such as a resistive heating element, is located in the helium vessel 44. The heater typically maintains a positive pressure condition, such as a pressure greater than that of the environment (i.e., greater than approximately 0 psig or 14.7 psia). As discussed further below, while the cold head, in general, operates continuously, power to the heating element 62 cycles to maintain an equilibrium within the vessel. In a present embodiment, power to the heating element is controlled in a closed-loop manner based upon pressure detected within the vessel, to maintain the pressure between desired minimum and maximum levels, and thus to maintain the desired temperature.

Alternatively, if, for example, the equilibrium is biased towards the gaseous phase by the cold head operating inefficiently or external heat sources, the pressure in the vessel 44 may increase, along with a potential increase in the temperature of the helium, leading to an undesired venting of helium and/or degradation in image quality. As discussed further below, if a high-pressure condition is detected, a condensing system controller 66 may optimize and adjust operations of the condensing system 54 to bias the equilibrium of the helium towards the liquid phase, thereby reducing the pressure in the vessel 44.

To monitor operation of the MRI scanner 12, a plurality of sensors 68 may be located throughout the MRI scanner 12, and particularly on or in the main magnet structures and support systems. For example, temperature and pressure sensors, collectively indicated generally by reference numeral 66, located in the vessel 44 may monitor conditions in the helium vessel 44. Additionally, other sensors 68 may monitor the cooling system 54 (e.g., operation of the cold head 58 and the compressor 60). Similarly, yet other sensors 68 may monitor the pressure control circuit and heating system (e.g., operation of the heater controller and heating element 62). Of course, there may be any number of sensors 68 located throughout the MRI scanner 12 for monitoring any number of conditions.

The various sensors 68 throughout the system may provide operational data regarding the MRI scanner 12 to monitoring circuitry 24. Moreover, the heater controller and the cooling system controller, and in general, components of a pressure control circuit, may also provide data to the monitoring circuitry 24. By way of example, the monitoring circuitry 24 may receive and process data regarding the temperature within the vessel, the pressure within the vessel, the heater duty cycle, coolant (refrigerant) pressure within the condensing/compressor system, or a host of any other operating conditions regarding the MRI scanner. Advantageously, the monitoring circuitry may be configured to communicate the processed and received information to the network 32 as well as to the user interface 28 (see FIG. 1). In general, operating conditions may be examined to control and maintain magnet temperatures and superconductivity, to evaluate magnet performance and MRI system performance, to decide service intervals, and so forth.

As previously discussed, an approach for maintaining the low magnet temperatures and thus superconductivity and MRI image quality, is to surround the magnet with a boiling liquid pool of a coolant or refrigerant, such as a cryogen. Boiling liquid pools, because of their use of heat of vaporization to consume heat, promote a constant magnet temperature. In other words, because a liquid boils at constant temperature (at fixed pressure), a boiling coolant may better maintain constant the desired magnet temperature. In contrast, the temperature of a coolant operating below its boiling point may vary with changes in sensible heat. Additionally, the boiling liquid pool is generally suited for isolated stand-alone systems, such as the typical cryogenic cooling application in an MRI system. For example, the condensing (cold head) and vaporizing (heater) actions on the cryogen may be implemented within the cryogenic cooling system. In contrast, coolant systems that primarily absorb sensible heat below the coolant's boiling point generally require processing of the coolant to remove the absorbed sensible heat, and thus, may require a relatively sophisticated integration, for example, with a coolant utility system. What is more, with a vaporizing liquid, the heat of vaporization is typically a larger consumer of heat per pound of refrigerant than a non-vaporizing liquid (sensible heat). Thus, for coolant systems relying on sensible heat, more coolant inventory is generally required in the cooling system. And finally, boiling cryogens may be attractive, for example, because of their low boiling points which permit avoidance of vacuum operating conditions in achieving the desired low temperatures.

In the example of a desired magnet temperature of 4 K, liquid helium may be especially suited for the cryogen application because the atmospheric boiling point of helium is about 4 K. In other words, the helium boils at 4 K, the desired magnet temperature, at relatively low, positive, operating pressures (i.e., near atmospheric), generally permitting simpler and more economical system designs than, for example, vacuum conditions for coolants with higher boiling points, or with higher operating pressures for compressed refrigerant systems. Other cryogens, such as nitrogen, may vaporize at the desired 4 K but under vastly different operating pressures. At typical operating pressure of 4 psig and temperature of 4 K, nitrogen is a solid. As will be appreciated by those skilled in the art, both vacuum conditions and high operating pressures for the cryogen that surrounds the magnet are generally to be avoided. A cryogen operating at a pressure less than that of the environment may drive air from the environment into the cryogen and thus contaminate the cryogen system. For the opposite end, at high operating pressures, cryogen leaks to the environment, for example, through fittings, gaskets, and the like, may increase with increasing pressure. Vacuum conditions or high operating pressures generally require equipment rated for those conditions and may complicate operation and maintenance of the equipment.

A useful aspect of the cryogen pool is that control of cryogen pressure may be used to maintain a vaporizing cryogen, such as helium, at a pressure advantageous to system design issues discussed above, as well as, to give a desired boiling point temperature that corresponds to the desired magnet temperature. As previously discussed, the cryogen pressure may be controlled, for example, by removing heat and condensing helium vapor (i.e., via a cold head) or by adding heat and vaporizing helium liquid (i.e., via a heater). Additionally, cryogen pressure elevated above a predetermined pressure setting may be dissipated by relieving cryogen (primarily vapor), for example, through a relief device. For predictive maintenance and other reasons, the cryogen pressure and related heater duty cycle may be indicative of performance of the superconducting magnet system.

The monitoring of heater duty cycle in accordance with the present technique may accommodate advanced notification of cryogen system behavior, such as changes in the pressure-temperature equilibrium, as well as, changes in performance of system components (e.g., cold head, heater, thermal insulation, and so forth). Ultimately, the magnet temperature may be adversely affected, for example, by undesirable performance of such components, as well as, by excessive heat transfer from the environment. Again, the magnet and cryogen configuration may be insulated, for example, with insulating material and/or vacuum regions to deter heat transfer from the environment to the magnet and cryogen. Indeed, absent insulation or other heat transfer barrier, significant heat transfer may occur because of the low operating temperature of the magnet and cryogen relative to ambient temperatures.

Figure 3:
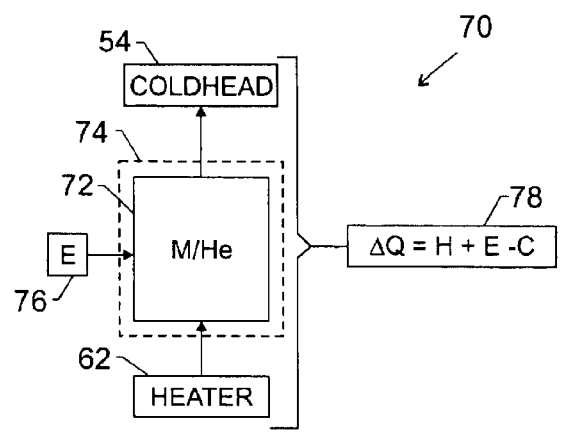
FIG. 3 is a graphical representation of an energy balance of a recondensing superconducting magnet system.

FIG. 3 is a graphical representation of an energy balance 70 of a recondensing superconducting magnet system. In particular, FIG. 3 graphically illustrates an energy balance 70 of the ideally closed system 72 of the magnet 40 and surrounding helium 42 and 46 depicted in FIG. 2. A theoretical heat transfer boundary 74 is denoted by a dashed line. The heater 62 adds heat to the system 72 and the cold head 54 removes heat from the system 72. Additionally, because the system 72 may operate at temperatures lower than ambient, heat transfer may also occur from the environment 76 to the system 72. In sum, the change in heat, $\Delta Q$, equals the heat, H, added by the heater plus the heat, E, added by the environment minus the heat, C, removed by the cold head (equation 78).

Undesirable boil-off is often related to the heating and cooling equilibrium required for proper operation of conventional and recondensing thermal systems. There may be a multitude of variables that contribute to an imbalance in this equilibrium resulting in non-zero boil-off operation of the recondensing thermal systems. Such variables may include, for example, degrading cooling capacity of the cold head (cryo-cooler machine) over its operation life, plumbing leaks in the pressure system that violate the closed system requirement, and environmental effects such as facility issues preventing optimal cold head (cryo-cooler system) functionality. The technique provides earlier possible identification of failures related to such variables, as well as, helps isolate the nature or root cause of the problem. The technique provides for observation of heater duty cycle, and in general, observation of the duty cycle of the active component of a pressure control circuit, to evaluate total thermal system performance.

The present technique provides advantages over other approaches. For example, with degraded cold head capacity, instrumentation of sufficient accuracy to directly observe the subtle increase in operating temperature resulting from reduced cooling capacity may be cost prohibitive for wide deployment. Additionally, RF interference generated by the MRI scan itself and magnetic interference from the MRI system's gradient fields introduce additional noise into this already difficult measurement. Furthermore, in general, the use of local field instrumentation, such as level gauges, pressure gauges, and temperature elements, to directly observe thermal system parameters may not be of sufficient resolution or accuracy to make early diagnosis of abnormal behavior, for example, with internal pressure leaks due to defective valves or seals. In response, one embodiment of the present technique provides for relying observation of the "effects," such as heater duty cycle behavior, of for example, reduced cooling capacity, early enough in the failure cycle to prevent helium loss.

Advantages of the present technique are demonstrated by the fact that observation of heater duty cycle (i.e., percent of on-time/total elapse time) may be conclusive in identifying and differentiating, for example, degraded cold head capacity versus pressure leaks. For example, a lack of cooling (excess heat) causes the heater duty cycle to be lower than normal. Less effort is required by the active heater to maintain desired cryogen vessel (cryostat) pressure. In contrast, pressure leaks cause the duty cycle to be higher than normal. More effort is required by the active heater to make up for the pressure losses due to the leaks. Duty cycle may be a function of individual thermal systems and once proper operation is obtained, the duty cycle for a given system can be benchmarked for future evaluation of that system. Generally speaking, for one family of products of superconducting magnet systems or MRI systems may have a normal heater duty cycle that ranges, for example, from twenty percent to thirty percent over a rolling seven day period during normal C0BO operation. Other families of products may have different normal duty cycles, such as less than twenty percent or greater than thirty percent.

Figure 4:
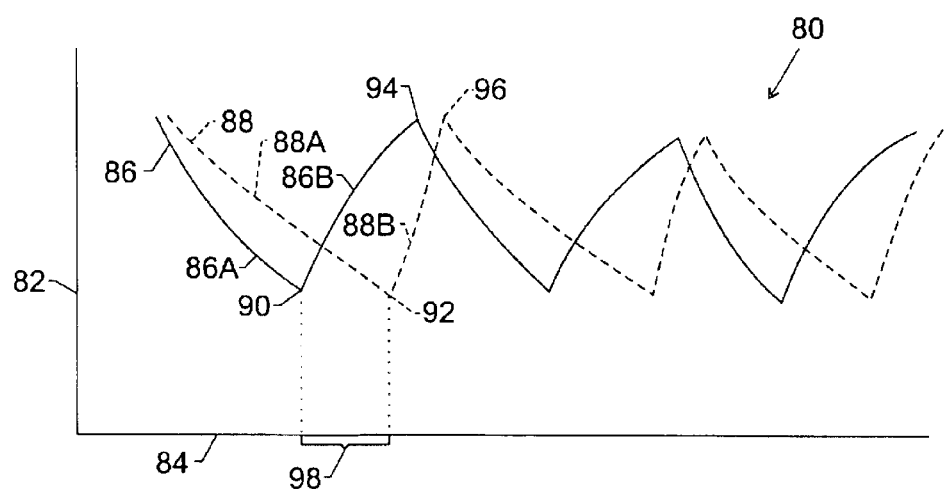
FIG. 4 is a representative plot of normal and abnormal pressure curves in which pressure of the helium vapor is plotted versus time.

FIG. 4 is a plot of pressure curves 80 which exhibit a saw tooth behavior and are a plot of pressure 82 of the helium vapor 46 (FIG. 2) versus time 84 (having a scale of hours in this example). The normal curve, denoted by reference numeral 86, represents operating pressure within the helium vessel during normal operation. The second pressure curve, the abnormal curve, is denoted by reference numeral 88 and is shown as a dashed line, and may be indicative, for example, of a failing cold head 58. The decreasing portions of the curve 86 and 88, denoted by reference numerals 86A and 88A, respectively, generally correspond to the heater 62 turned off or deenergized. The increasing pressure portions of the curves 86 and 88, denoted by reference numerals 86B and 88B, respectively, are indicative of when the heater is turned on and energized, and liquid helium is being vaporized.

In this illustrative embodiment, the failing cold head 58 is removing less than the desired or specified amount of heat. Thus, during this abnormal operation, as deduced from the plot 80, the heater is on less of the time, or in other words, the heater duty cycle is lower. For abnormal operation, the pressure curve 88 decreases with a less steep slope (a slower pressure decrease) because the cold head is failing (condensing less helium vapor and removing less heat). In sum, because the cold head is removing less heat, the need to add heat is less, and thus the heater duty cycle is lower.

In this example, points 90 and 92 represent the low-pressure control point, when the heater turns on. In contrast, points 94 and 96 represent the high-pressure control point at or near the time when the heater turns off. The time span 98 represents the increased amount of time that the heater is turned off during the abnormal operation of the system compared with normal operation. Additionally, the plot 80 further demonstrates that the heater remains on less during abnormal operation, for example, with the increasing portion 88B of the abnormal curve steeper than the increasing portion 88A of the normal curve.

An aspect of the present technique is to observe behavior of an abnormal pressure curve 88 and the related abnormal heater duty cycle to give advance warning of a malfunctioning recondensing magnet system in advance of losing liquid helium level. In other words, the active component, such as a heating controller and/or heating element, of a pressure control circuit may be monitored to evaluate the cryogenic cooling system. It should be noted that though pressure is discussed, it may be advantageous to monitor heater duty cycle directly. Additionally, depending on the context, macro changes or overall drifts in pressure tend to be less informative than the heater duty cycle.

For example, without monitoring of the heater duty cycle, pressure leaks may not be readily apparent until significant helium level is already lost and a level alarm is activated. For recondensing cryogenic cooling systems, the use of a tighter low-level alarm is generally problematic because of the normal system variation in level. Moreover, in recondensing systems, the use of pressure indication to warn of pressure leaks is also problematic. For example, the system will generally maintain pressure in spite of the leaks, and thus preempt warning based on pressure. For instance, in practice, the control loop that regulates helium vessel (cryostat) pressure will sense lower pressure, whether caused by proper recondensing process or vessel leaks. In either case, the pressure controller will activate the heater to intentionally boil liquid helium to maintain the desired pressure set point. Therefore, in the case of vessel leaks, the system will maintain the pressure until level is gone, boiling liquid helium to make up for the losses due to the leaks, and thus, result in non-zero boil-off operation and a late warning via a low-level alarm.

Figure 5:
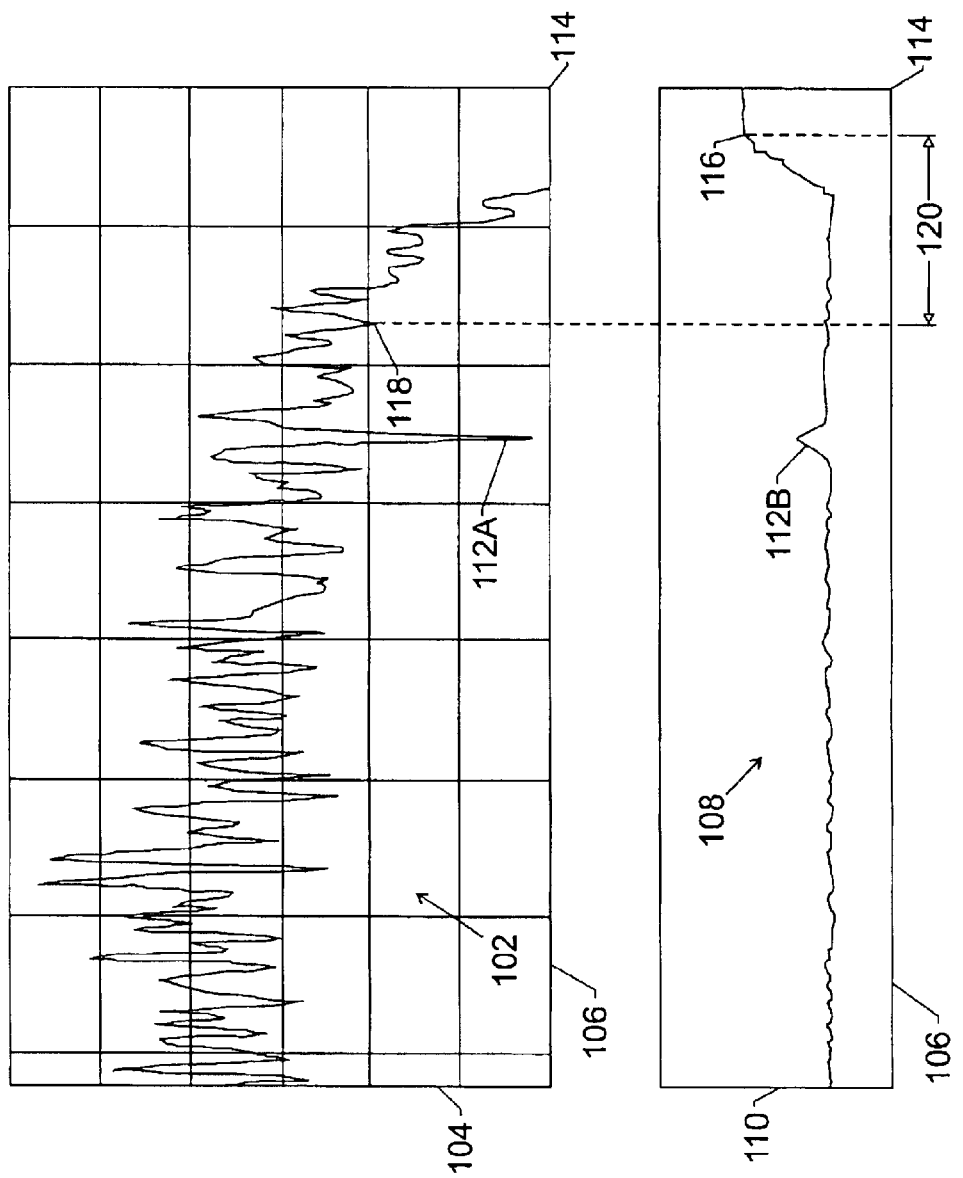
FIG. 5 is a graphical representation of operating data of a recondensing superconducting magnet system, showing a heater duty cycle curve as a plot of the percent time the heater is turned on (energized) versus time in months, contrasted with a pressure curve which is a plot of helium vessel pressure versus the same time scale in months.

FIG. 5 is a graphical representation of operating data 100 of a recondensing superconducting magnet system showing a heater duty cycle curve 102 and a pressure curve 108. The heater duty cycle in percent 104 of the time that the heater is energized is plotted versus time 106. Pressure 110 of the helium vapor in the helium vessel is also plotted versus time 106. In this example, the horizontal axis (time 106) represents about seven months. The normal operating pressure during normal operation is about 4.0 psig and is contrasted with the pressure curve of FIG. 4 because of the different time scale (months versus hours). Additionally, in this example, the normal heater duty cycle during normal operation is about 20 percent, or in other words, the heater is normally energized about 20 percent of the time.

An abnormal event is denoted by points 112A and 112B, which may be, for example, a scheduled or unscheduled outage (or shutdown). From time to time, the MRI scanner 12 may require maintenance. For example, the cold head 58 may begin to lose efficacy, the imaging coils may require calibration, the image quality may be deteriorating, and/or the filter may require cleaning, to name but a few types of service maintenance. Moreover, the helium 44 may reduce to undesirable levels and/or may reach undesirable temperatures, at which the magnet 40 may lose superconductivity. Accordingly, servicing of these systems of the MRI scanner 12 may be required. Service maintenance, however, may require taking the MRI scanner 12 offline, i.e., downtime. Additionally, the MRI scanner 12 may require routine maintenance, such as calibration and testing, to sustain effective operations. Routine maintenance is typically conducted at predetermined intervals and may also require taking the MRI scanner 12 offline.

Point 114 at the end of the horizontal axis for both the plotted duty cycle and pressure data represents the time at which the helium vessel begins losing liquid level. Point 116 represents when the high pressure alarm in the helium vessel is indicated and when the relief device vents helium vapor to the environment which, in this example, occurs about one week in advance of the low-level alarm. Point 118 represents a point when the heater duty cycle dropped to 10 percent, or about half of the normal 20 percent duty cycle, and which occurred about one month in advance of the high-pressure alarm.

Thus, in this example, monitoring the heater (element) duty cycle provided a one-month advantage (distance 120) over pressure indication, and an even greater advantage over level indication. Accordingly, for example, replacement of the cold head 58 may be scheduled in advance. Rather than reactively replacing the cold head 58 upon failure, the cold head 58 may be replaced proactively based upon the predicted time interval until failure. Advantageously, such proactive maintenance can reduce delays due to unavailable parts and/or technicians, for example. Additionally, earlier indication of sub-optimal thermal system operation provides increased lead time to troubleshoot root cause and to effect a solution before the relief valve opens and allows helium to escape or before some other undesirable result occurs, such as equipment damage.

For helium loss, a material expense to be avoided, aspects of the present technique may make it possible to identify, troubleshoot, and correct issues before helium loss occurs. This is generally a better approach than monitoring level, as was the focus for the previous open loop thermal designs prior to recondensing technology. As discussed earlier, previous "open loop" thermal designs prior to recondensing technology allowed for routine and expected boil-off gas to exit the helium vessel resulting in a measurable drop in liquid level in the vessel over time. In those systems, the comparison of level drop to design norms provided relatively useful information. In contrast, recondensing systems, which typically have negligible loss of helium, are better monitored by other variables, such as helium vessel pressure and especially heater duty cycle. The level design norms for open systems are of little application in the recondensing systems.

It may be beneficial to determine a normal operating value for heater duty cycle for the particular system of interest and to specify a tolerance based on, for example, normal system variation in the heater duty cycle. Both the normal operating value and the specified tolerance may be based on operating history and/or design conditions of the specific magnet/cryogen system, similar magnet systems, MRI system, and so forth. In the example illustrated in FIG. 5, the determined value of the normal duty cycle is 20% and the tolerance is +/−10% (or +/−50% of the normal duty cycle). Normal values and tolerances may be roughly estimated, or rigorously determined, for example, via statistical analysis of system operating history.

Furthermore, the normal value of 20% (FIG. 5) is only given as an example. Indeed, duty cycles greater than 20% are more common in the art. Moreover, it should be apparent that though the cold head runs continuously and is not used for primary control, the heater duty cycle is related to the operation of the corresponding cold head. Typical cold heads generally corresponds to heater duty cycles of about 25% to 35%. On the other hand, the use of newer design cold heads manufactured by certain suppliers may generally result in heater duty cycles of up to 50% or more.

Furthermore, in the superconducting magnet system, the heating component, the pressure control circuit, the heater duty cycle, and the like, may be defined and implemented in a variety of ways. For example, in the embodiments discussed thus far, heater duty cycle has generally represented the amount of time the heater (i.e., a constant heater) is energized, with constant amplitudes of energization but non-uniform periods of time the heating element is energized. Instead, the duty cycle may be defined in the context of uniform periods of heating element energization and with variable amplitude of energization (i.e., a variable heater). There are many different approaches to realizing a duty cycle. Moreover, instead of on/off control, the heater controller may incorporate, for example, proportional-integral-derivative (PID) control in a constant or variable heater scheme to maintain the desired cryogen pressure and magnet temperature.

Additionally, the concept of duty cycle may not be tied to heating the system, (i.e., heating controller or heating element), but instead tied to some other active component of the pressure control scheme that ultimately maintains the desired magnet temperature. In general, the pressure controller may be an indicator of thermal performance of the cryogen system. After all, one of the important aspects of the cryogen system is the usual ability to control temperature by controlling pressure. Thus, the focus of duty cycle may generally be tied to any pressure control scheme, not necessarily the aforementioned pressure control circuit having a heater duty cycle. On the whole, examination of thermal performance of a cryogen system may be tied to monitoring various behaviors, such as a duty cycle of any pressure control circuit (including the active component) that maintains pressure in the cryogen system.

Figure 6:
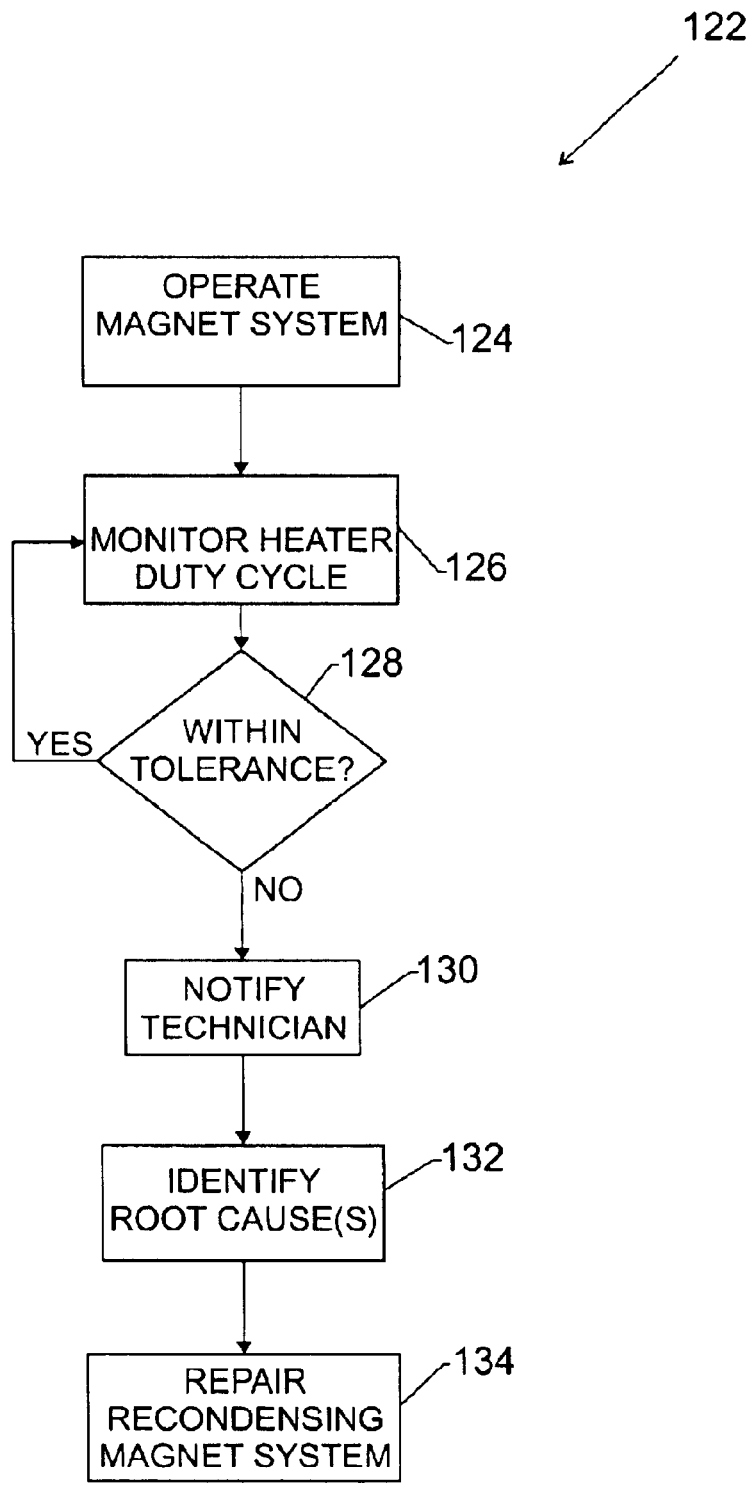
FIG. 6 is a block diagram of a magnet monitoring method 122 in accordance with aspects of the present technique.

Referring to FIG. 6, a block diagram of a magnet monitoring method 122, is depicted. Initially, the recondensing magnet system is started up and operated (block 124). The heater duty cycle is monitored (block 126), and if the duty cycle falls outside a set point plus or minus a predetermined tolerance (block 128), the monitoring system may notify the appropriate system or person, such as a service technician (block 130). Various alarm methods or indicia may include, for example, a signal to an indicator or indicator system, an audible alarm, a signal to a control system, an electronic message (i.e., notifying a service technician by email), an indicating light on a graphical-user interface, and the like. After indication of abnormal duty cycle, a technician, for example, identify root causes (block 132) of the out-of-specification heater duty cycle and service the magnet system accordingly.

As previously discussed, abnormal behavior of the heater duty cycle may reflect other problems in the system. For example, a lower-than-normal duty cycle may be indicative of a failing cold head, loss of vessel insulation, and so forth. A higher-than-normal duty cycle may be indicative, for example, of cryogen system leaks, a failing heater, and so forth. In sum, the heater duty cycle data may assist the technician in identifying the nature and root causes of system performance problems. Ultimately, the technician may repair or reconfigure the recondensing magnet system, for example, to restore the desired magnet temperature (block 134). Finally, it should be noted that aspects of the present technique may be incorporated in both normal operating applications and servicing applications (software and hardware) of MRI systems, NMR systems, spectroscopy systems, superconducting magnet systems, and so forth.

In sum, the technique provides for determining a specific and actionable diagnosis early in a failure cycle. Other methods, such as waiting for levels to drop may not be adequate in preventing helium loss, as level dropping indicates a loss is already occurring, which is generally a late warning in recondensing systems. And though, in some circumstances, cryostat pressure may provide better warning than the traditional approach of level indication, waiting for an increase in cryostat pressure typically fails to give enough advance notice prior to the relief valve opening, resulting in helium loss, potential degradation of MRI image quality, and the impending need for servicing of the MRI system. Aspects of the present technique, such as the monitoring heater duty cycle, may facilitate predictive maintenance, for example, and thus reduce maintenance times, periods of deactivation, costs, and so forth.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method for operating a superconducting magnet system, comprising:
    monitoring a duty cycle of a heating element that supplies heat to the superconducting magnet system;
    comparing the duty cycle to a predetermined value; and
    providing an indication of a condition of the magnet system based upon the comparison.

2. The method of claim 1, wherein the duty cycle represents the periods of time that the heating element is energized and is expressed in percent of the time the heating element is energized;
    wherein the periods of time are non-uniform lengths of time and amplitude of energization is substantially constant; and
    wherein the heating element is configured in an on/off control scheme and is a constant heater when energized.

3. The method of claim 1, wherein the predetermined value of the duty cycle generally corresponds to an operating norm of the duty cycle and a specified tolerance is 50 percent of the predetermined value.

4. The method of claim 1, further comprising notifying a technician or alarming when the duty cycle falls outside a tolerance; and
    wherein the duty cycle is monitored remotely and is used as a variable to determine when the superconducting magnet system is to be serviced.

5. The method of claim 1, further comprising identifying the one or more root causes of changes in the duty cycle.

6. The method of claim 1, wherein amplitude of energization varies and the heating element is a variable heater in a proportional-integral-derivative (PID) control scheme.

7. The method of claim 1, wherein the amplitude of energization varies and the periods of time the heating element is energized are constant.

8. The method of claim 1, wherein the superconducting magnet system provides one or more magnetic fields in a magnetic resonance imaging (MRI) system.

9. The method of claim 1, further comprising monitoring pressure in a cryogen vessel disposed in the superconducting magnet system; and wherein the monitored pressure is used as a variable in determining when the superconducting magnet system is to be serviced.

10. A method for monitoring a superconducting magnet system, comprising:

monitoring an energization of a heating element that supplies heat to a superconducting magnet system;

comparing the energization to a specified tolerance; and indicating when the energization falls outside the specified tolerance.

11. The method of claim 10, wherein the energization is controlled, monitored remotely, and used as a variable to determine when the superconducting magnet system is to be serviced.

12. The method of claim 11, wherein indicating when the energization falls outside the specified tolerance comprises at least one indicia of a signal to an indicator or indicator system, an audible alarm, a signal to a control system, an indicating light on a graphical-user interface, and an electronic message.

13. The method of claim 11, wherein the superconducting magnet system is repaired or reconfigured in response to indication of the energization falling outside of the specified tolerance and to conform the energization to within the specified tolerance.

14. The method of claim 10, wherein the superconducting magnet system provides one or more magnetic fields in at least one of a magnetic resonance imaging (MRI) system, nuclear magnetic resonance (NMR) system, and a spectroscopy system.

15. A method for operating a superconducting magnet system, comprising:

monitoring a duty cycle of a pressure control circuit that controls pressure in a cryogen vessel in the superconducting magnet system;

comparing the duty cycle to a predetermined value; and providing an indication of a condition of the magnet system based upon the comparison.

16. The method of claim 15, wherein cryogen vessel holds a helium liquid pool that surrounds one or more magnets in the superconducting magnet system.

17. A superconducting magnet system, comprising:

a cryogen vessel that contains or surrounds one or more magnets disposed in the superconducting magnet system;

a heating element disposed within the cryogen vessel;

a heater controller for controlling energization of the heating element which vaporizes a cryogen liquid disposed in the cryogen vessel;

a monitoring system comprising one or more interfaces and one or more sensors for remotely monitoring the energization of the heating element; and one or more indicators for indicating when the energization falls outside a predetermined tolerance.

18. The system of claim 17 further comprising a relief device disposed on or near the cryogen vessel.

19. The system of claim 17, wherein the energization of the heating element is adjusted to control pressure in the cryogen vessel and to control temperature of the one or more magnets.

20. The system of claim 19, wherein the cryogen liquid comprises helium liquid.

21. The system of claim 20, wherein the pressure of the cryogen vessel is controlled in the approximate range of 4.0 to 4.5 psig and the temperature of the magnets is controlled at approximately 4 Kelvin.

22. The system of claim 18, further comprising a cold head for condensing cryogen vapor from the cryogen vessel, and wherein operation of the cold head affects cryogen pressure and thus affects the temperature of the one or more magnets.

23. The system of claim 22, wherein the heater controller is configured for at a constant heater in an on/off control scheme with constant amplitude energization while the heater is on and the heating element is energized.

24. The system of claim 23, wherein periods of time the heating element is energized are non-uniform in length of time.

25. The system of claim 22, wherein the heater controller is configured for a variable heater in a proportional-integral-derivative (PID) control scheme with variable amplitude energization of the heating element.

26. A superconducting magnet system, comprising:

a heater controller that controls an energization rate of a heating element disposed within a superconducting magnet system;

a control system, one or more interfaces, and one or more sensors for remotely monitoring the energization rate of the heating element; and one or more indicators for indicating when the energization rate of the heating element falls outside a specified tolerance.

27. The system of claim 26, wherein the superconducting magnet system is disposed within a magnetic resonance (MR) imaging system.

28. The system of claim 27, wherein the one or more interfaces for monitoring the energization of the heating element comprise at least one of a laptop, a computer, a workstation, a network connection, and a MR imaging system interface.

29. The system of claim 28, further comprising:

a cryogen vessel disposed in the superconducting magnet system and holding a cryogen at its boiling point for cooling one or more magnets;

a cold head configured for removing heat from the superconducting magnet and condensing cryogen vapor received from a vapor space of the cryogen vessel;

a refrigerant compressor system that supplies refrigerant to the cold head to cool the cold head; and a relief vent disposed in the superconducting magnet system for relieving cryogen vapor to control pressure and temperature within the superconducting magnet system.

30. A system for operating a superconducting magnet system, comprising:

means for controlling and adjusting the energization of a heating element that supplies heat to the superconducting magnet system;

means for monitoring the energization of the heating element;

means for comparing the energization of the heating element to a predetermined value; and means for providing an indication of a condition of the magnet system based upon the comparison.

31. The system of claim 30, wherein the means for controlling energization controls the temperature of one or more magnets disposed in the superconducting magnet system by controlling pressure within a cryogen vessel that surrounds the one or more magnets.

32. The system of claim 30, comprising means for remotely monitoring the energization of the heating element.

33. The system of claim 32, further comprising:

means for notifying a technician when the energization falls outside a specified tolerance;

means for identifying one or more root causes of changes in the energization; and means for conforming the energization of the heating element to within the specified tolerance.

34. The system of claim 30, further comprising:

means for relieving pressure and cryogen vapor from the superconducting magnet system;

means for condensing the cryogen vapor disposed within the superconducting magnet system and for removing heat from the superconducting magnet system.

35. A system for monitoring a superconducting magnet system, comprising:

means for monitoring a duty cycle of a heating element that supplies heat to the superconducting magnet system;

means for comparing the duty cycle to a predetermined value; and means for providing an indication of a condition of the magnet system based upon the comparison.

36. The system of claim 35, wherein the superconducting magnet system is disposed in at least one of a magnetic resonance imaging (MRI) system, nuclear magnetic resonance (NMR) system, and a spectroscopy system.

37. The system of claim 35, further comprising means for controlling energization of the heating element.

38. The system of claim 37, comprising means for controlling the amount of time the heating element is energized, and wherein duty cycle is defined as the percent of time that the heating element is energized.

39. A computer program, provided on one or more tangible media, for operating a superconducting magnet system, comprising:

a routine for controlling and adjusting the energization of a heating element that supplies heat to the superconducting magnet system;

a routine for remotely monitoring the energization of the heating element;

a routine for comparing the energization of the heating element to a predetermined value; and a routine for providing an indication of a condition of the magnet system based upon the comparison.

40. The computer program of claim 39, further comprising:

a routine for notifying a technician when the energization falls outside a specified tolerance.

41. A computer program, provided on one or more tangible media, for monitoring a superconducting magnet system, comprising:

a routine for monitoring a duty cycle of a heating element that supplies heat to the superconducting magnet system;

a routine for comparing the duty cycle to a predetermined value; and a routine for providing an indication of a condition of the magnet system based upon the comparison.

42. The computer program of claim 41, further comprising a routine for controlling energization of the heating element.

* * * * *